(12) United States Patent
Olzak

(10) Patent No.: US 7,046,506 B2
(45) Date of Patent: May 16, 2006

(54) CIRCUIT BOARD CARD GUIDE AND LOCK

(75) Inventor: Richard A. Olzak, Kirkland, WA (US)

(73) Assignee: Honeywell International Inc., Morristown, NJ (US)

( * ) Notice: Subject to any disclaimer, the term of this patent is extended or adjusted under 35 U.S.C. 154(b) by 41 days.

(21) Appl. No.: 10/802,979

(22) Filed: Mar. 17, 2004

(65) Prior Publication Data

US 2005/0207099 A1 Sep. 22, 2005

(51) Int. Cl.
*H05K 7/14* (2006.01)
(52) U.S. Cl. ............ 361/679; 361/801; 257/659; 439/136
(58) Field of Classification Search ........ 361/740, 361/741, 747, 752, 801–802, 679–687, 724–722; 700/299, 300; 257/659; 439/136–137
See application file for complete search history.

(56) References Cited

U.S. PATENT DOCUMENTS

| | | | |
|---|---|---|---|
| 3,418,533 A | * | 12/1968 | Perotto .............. 361/688 |
| 4,751,963 A | | 6/1988 | Bui et al. |
| 5,036,428 A | | 7/1991 | Brownhill et al. |
| 5,218,760 A | * | 6/1993 | Colton et al. .............. 29/845 |
| 5,757,618 A | * | 5/1998 | Lee .............. 361/686 |
| 6,687,134 B1 | * | 2/2004 | Vinson et al. .............. 361/798 |
| 6,832,923 B1 | * | 12/2004 | Sasame et al. .............. 439/137 |

FOREIGN PATENT DOCUMENTS

WO   WO 00/04810   2/2000

OTHER PUBLICATIONS

APW Electronic Solutions, Series 127 Lok-Tainer Screw-actuated, Chassis Mount, Non Cold Wall, pp. 40-41, Jan. 1980.

\* cited by examiner

*Primary Examiner*—Hung Van Duong
(74) *Attorney, Agent, or Firm*—Honeywell Int'l Inc.

(57) ABSTRACT

A printed circuit board chassis device for securely holding printed circuit boards (PCB) while allowing for easy insertion and extraction. The device includes circuit board securing devices. The securing devices include a base section and a securing member. The base section is attached to a structural component of the chassis device. The base section includes a groove formed by a first and second wall. A first component moves the securing element at a first end longitudinally within the groove of the base section. A second component keeps a second end of the securing element within the groove of the base section. Force-producing devices move the securing element closer to the first wall of the base section as the first component is adjusted.

12 Claims, 3 Drawing Sheets

CIRCUIT BOARD CARD GUIDE AND LOCK

FIELD OF THE INVENTION

This invention relates to fasteners, and more particularly to computer cabinet fasteners for printed circuit boards.

BACKGROUND OF THE INVENTION

In many complex systems, such as aircraft, many computer functions are performed by modular printed circuit boards (PCBs) located within a chassis, such as an Aerospace Environment Support Unit (AESU) or a Communication Management Unit (CMU). The chassis allows operators and maintenance personnel to efficiently stack multiple printed circuit boards. The chassis are light weight and made of a flimsy metal and thus are not very rigid devices. The PCBs inserted within the chassis are stiff, thus requiring some sort of guide and lock to secure the printed circuit board within the chassis. Because of the difference between the rigidity of the printed circuit boards and the chassis, electrical and mechanical connections between the PCBs and the chassis can be compromised in a vibrating environment such as an aircraft where extended periods of vibration occur.

Certain PCB track systems have been developed in order to securely hold the PCB within a chassis. One such device uses a track that includes multiple spring-loaded parts. A PCB stacked in this device is difficult to release because of the direction and location of the springs-loaded parts, thus, increased maintenance time and costs occur. Also, because these devices do not apply pressure to an entire edge of a printed circuit board, these devices may disconnect from electrical connections during moderate periods of vibration.

Therefore, there exists a need for securing printed circuit boards within a chassis during long periods of vibration and allowing a user to easily remove the printed circuit board from the chassis. There is also a need to lock a PCB securely in a stable or rigid chassis to preclude vertical excursion under vibration that may destroy connectors used at the ends of the boards for electrical and/or signal transmission.

SUMMARY OF THE INVENTION

The present invention provides a printed circuit board chassis device for securely holding printed circuit boards (PCB) while allowing for easy insertion and extraction. In one embodiment the device includes four walls orthogonally connected and at least two circuit board securing devices coupled to two of the four walls, wherein the two walls oppose each other. The securing devices include a base section and a securing member. The base section is attached to a respective wall. The base section includes a groove formed by a first and second wall. A first component moves the securing element at a first end longitudinally within the groove of the base section. A second component keeps a second end of the securing element within the groove of the base section. Force-producing devices move the securing element closer to the first wall of the base section as the first component is adjusted.

In one aspect of the invention, the first component includes a screw received through a slot in the base section and into a threaded cavity of the securing member.

In another aspect of the invention, the second component includes a set screw received through a threaded cavity of the base section and a slot of the securing member.

In still another aspect of the invention, the securing member includes one or more lateral support devices.

In yet another aspect of the invention, the force-producing devices include ramps located on the base section and the securing member.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
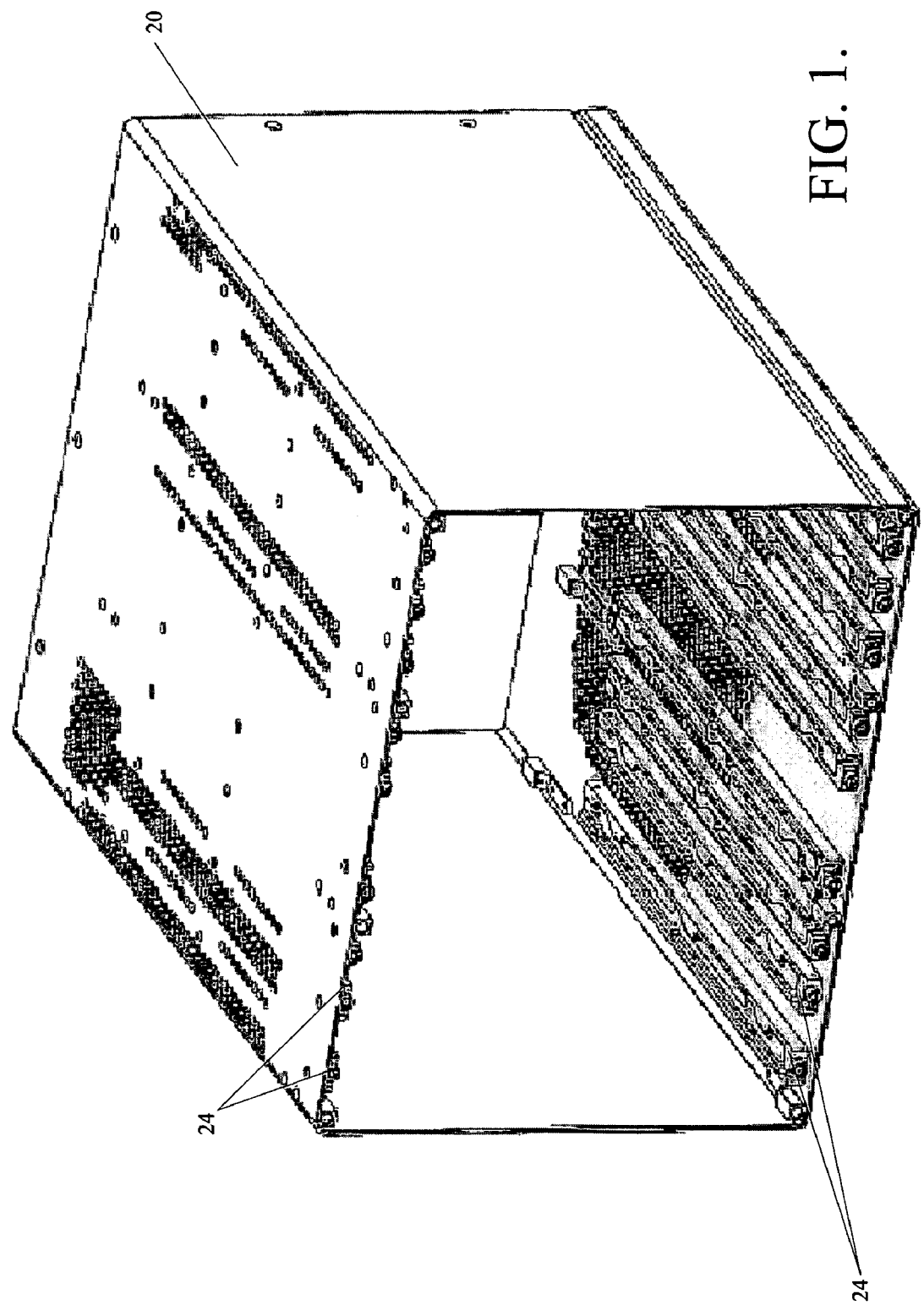
FIG. 1 illustrates a perspective view of a chassis that holds printed circuit boards and includes securing devices formed in accordance with the present invention.

FIG. 1 illustrates a perspective view of an example printed circuit board (PCB) chassis 20 that securely receives PCBs and allows the PCBs to connect to corresponding electrical buses. Mounted to an interior base and top of the chassis 20 are securing devices 24. The securing devices 24 are described in more detail below with regards to FIGS. 2–4. Although a rectangular chassis is shown, various geometrically shaped chassis may be used.

Figure 2:
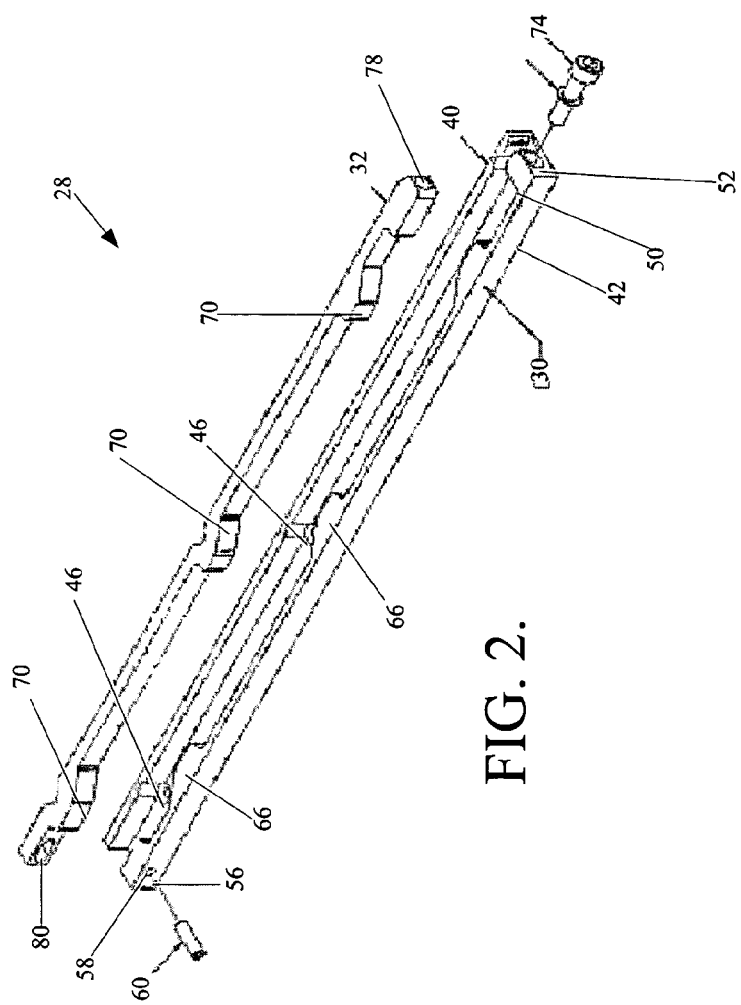
FIGS. 2 and 3 illustrates exploded views of an example securing device formed in accordance with an embodiment of the present invention.

FIG. 2 is a perspective exploded view of an embodiment of a securing device 28. The securing device 28 includes a base section 30 and a securing member 32. The base section 30 includes a lengthwise groove that is formed by a first wall 40 and a second wall 42. The base of the groove includes one more fastener holes 46 that receives a rivet, screw, or other type of securing device for mounting the base section 30 to the chassis 20. The second wall 42 includes a first end wall 50 that includes a slot 52.

An interior wall of the second wall 42 includes one or more ramps 66. The securing member 32 includes one or more ramps 70 that are oppositely opposed to the respective ramps 66. When the securing member 32 is placed in the groove between the first and second walls 40 and 42 of the base section 30, the ramps 70 and 66 face each other. A fastener, such as a screw 74, a toggle, or other mechanism that allows multiple longitudinal positions of the securing member 32 relative to the base section 30, passes through the slot 52 and is secured into a receiving cavity 78 at a first end of the securing member 32. As the screw 74 is tightened into the cavity 78, the securing member 32 moves toward the first end wall 50 of the base section 30 and the ramps 70 and 66 come in contact, thus moving the securing member 32 closer to the first wall 40. The slot 52 allows the screw 74 to slide laterally as the ramps 70 and 66 force the securing member 32 towards the first wall 40.

The first wall 40 also includes a second end wall 56 that includes a cavity 58 that is approximately perpendicular to the longitudinal axis of the base section 30. The cavity 58 receives a set screw 60. The set screw 60 is received at a second end of the securing member 32 in a cavity 80, thus keeping the securing member 32 within the groove of the base section 30. The cavity 80 allows movement of the securing member 32 along the longitudinal axis of the base section 30.

Before the screw 74 is tightened, a printed circuit board is slid into the groove formed between the first wall 40 and the securing member 32. As the screw 74 is tightened, the securing member 32 moves towards the first end wall 50 of the base section 30, thus putting pressure along the length of the end of the printed circuit board that is received within that slot.

The first and second walls 40 and 42 of the base section 30 are beveled at the first end wall 50 and the first end for directing travel of a PCB into the groove.

In one embodiment, the securing member 32 is a monolithic material.

Figure 3:
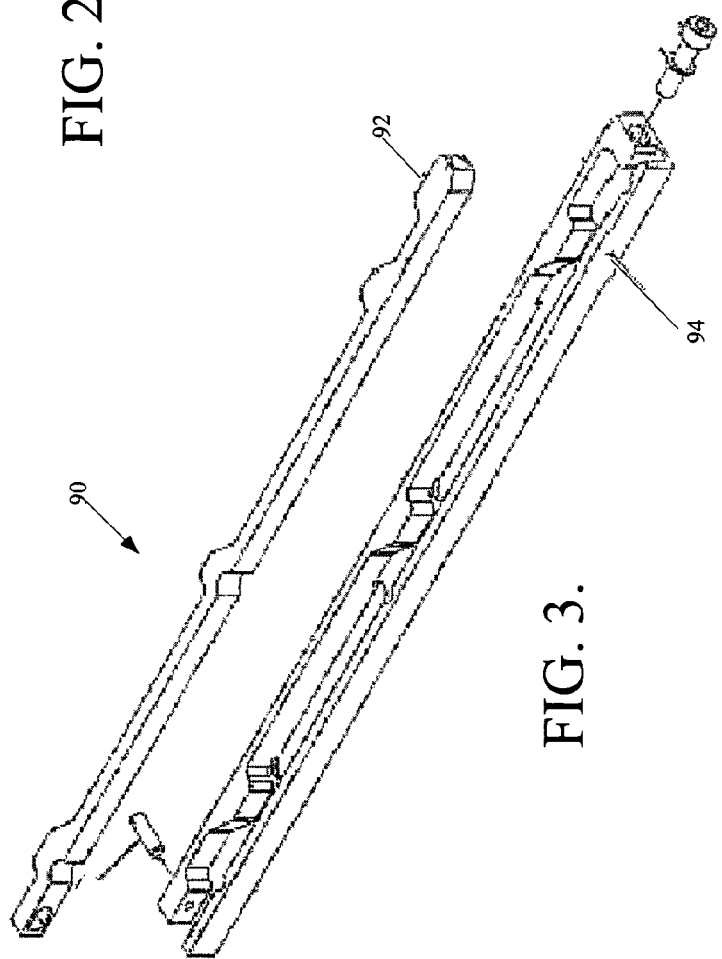

FIG. 3 illustrates a securing device 90 similar to the securing device 28 shown in FIG. 2 except that a PCB groove formed between a securing member 92 and a base section 94 is on the opposite side of the securing device 90.

Figure 4:
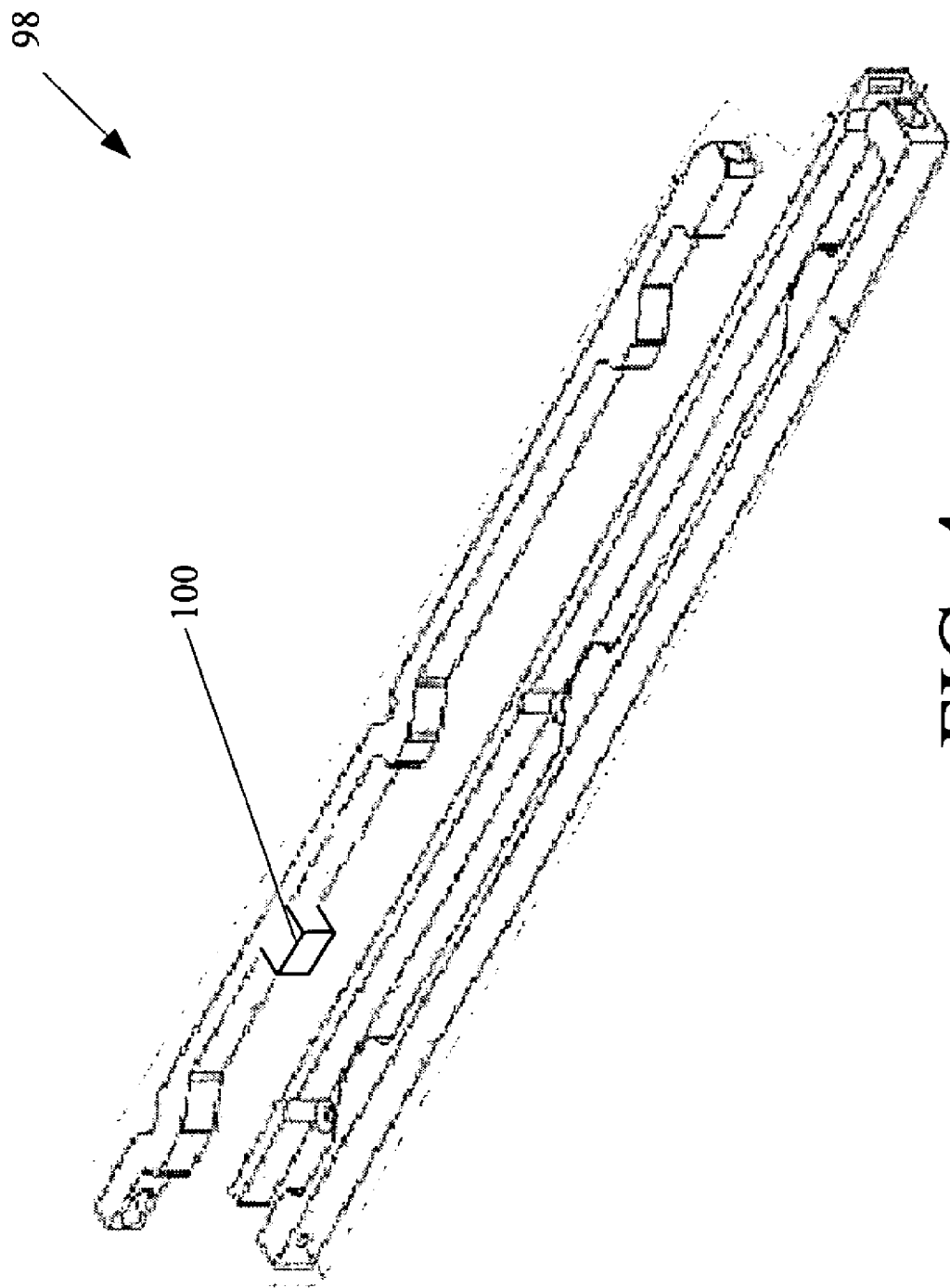
FIG. 4 illustrates an alternate embodiment of the present invention.

As shown in FIG. 4, an alternate embodiment of the present invention includes one or more support flanges 100 that are located on the securing member 32 on the same side as the ramp 70. The flanges 100 provide lateral support or stiffeners for the securing member 32.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A printed circuit board chassis device comprising:
   a structural component; and
   at least two circuit board securing devices coupled to the structural component, the securing devices comprising:
      a base section attached to a respective wall, the base section including a groove formed by a first and second wall;
      a securing member that is received by the base section;
      a first component configured to move the securing member at a first end longitudinally within the groove of the base section;
      a second component configured to keep a second end of the securing member within the groove of the base section; and
      one or more force-producing devices for moving the securing member closer to the first wall of the base section as the first component is adjusted, the one or more force-producing devices being coupled to the base section.

2. The device of claim 1, wherein the first component comprises a screw received through a slot in the base section and into a threaded cavity of the securing member.

3. The device of claim 1, wherein the second component comprises a set screw received through a threaded cavity of the base section and a slot of the securing member.

4. The device of claim 1, wherein the securing member comprises one or more lateral support devices.

5. The device of claim 1, wherein the force-producing devices comprise a plurality of ramps located on the base section and the securing member.

6. The device of claim 1, wherein the securing member is a monolithic member.

7. A circuit board securing device comprising:
   a base section including a groove formed by a first and second wall;
   a securing member that is received by the base section;
   a first component configured to move the securing member longitudinally within the groove of the base section;
   a second component configured to keep a second end of the securing member within the groove of the base section; and
   one or more force-producing devices for moving the securing member closer to the first wall of the base section as the first component is adjusted, the one or more force-producing devices being coupled to the base section.

8. The device of claim 7, wherein the first component comprises a screw received through a slot in the base section and into a threaded cavity of the securing member.

9. The device of claim 7, wherein the second component comprises a set screw received through a threaded cavity of the base section and a slot of the securing member.

10. The device of claim 7, wherein the securing member comprises one or more lateral support devices.

11. The device of claim 7, wherein the force-producing devices comprise a plurality of ramps located on the base section and the securing member.

12. The device of claim 7, wherein the securing member is a monolithic member.

* * * * *